(12) United States Patent
Conte et al.

(10) Patent No.: US 6,667,908 B2
(45) Date of Patent: Dec. 23, 2003

(54) READING CIRCUIT FOR A NON-VOLATILE MEMORY

(75) Inventors: Antonino Conte, Tremestieri Etneo (IT); Oreste Concepito, Palemro (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 13 days.

(21) Appl. No.: 10/154,417

(22) Filed: May 23, 2002

(65) Prior Publication Data

US 2002/0186586 A1 Dec. 12, 2002

(51) Int. Cl.$^7$ ............................................. G11C 16/06
(52) U.S. Cl. ................................. 365/185.2; 365/185.21
(58) Field of Search .................... 365/185.2, 185.21, 365/185.01, 189.07

(56) References Cited

U.S. PATENT DOCUMENTS 5,541,880 A * 7/1996 Campardo et al. ..... 365/189.09
5,959,919 A * 9/1999 Choi .......................... 365/207

* cited by examiner

*Primary Examiner*—Hoai Ho
(74) *Attorney, Agent, or Firm*—Lisa K. Jorgenson; Allen, Dyer, Doppelt, Milbrath & Gilchrist, P.A.

(57) ABSTRACT

A reading circuit for a memory includes a current detector for each bit line of the memory, a reference voltage generator, and a comparator that compares the reference voltage with the voltage of a reading terminal of the current detector. Each current detector includes a first transistor whose gate is selectively connected to the reading terminal, and whose drain-source path is in series with a respective bit line. An input of a first inverter stage is connected to the source of the first transistor, and an output thereof is connected to the gate of the first transistor. The circuit has a very short reading time based upon each of the current detectors including a first resistor between the source of the first transistor and the bit line, along with second and third transistors having their drain-source paths connected in series with the respective bit line, and along with second and third inverters connected to the respective bit line. First and second resistive elements are also connected between the first and second transistors and the respective bit line.

17 Claims, 4 Drawing Sheets

READING CIRCUIT FOR A NON-VOLATILE MEMORY

FIELD OF THE INVENTION

The present invention relates to memory devices, and in particular, to a reading circuit for a non-volatile memory.

BACKGROUND OF THE INVENTION

The present invention relates to memory It is well known that to read a cell within a matrix of non-volatile memory cells, i.e., for determining whether a given cell is in one of two binary logic states, appropriate voltages have to be applied between the electrodes of that cell. The cells are arranged in rows and columns and are connected to each other by row and column conductors. These conductors, also respectively known as word lines and bit lines, make it possible for each individual cell to be biased for reading.

When a cell has been selected and biased in this manner, it can be read by a reading circuit that determines whether or not the appropriate column conductor (bit line) carries a current at that moment. A given cell of a memory of the EEPROM type (electrically erasable and programmable read-only memory) is conventionally considered to be programmed or in a logic state 1 when it carries a current, and erased or in a logic state 0 when it does not carry a current.

FIG. 1 schematically illustrates a known reading circuit, indicated overall by the reference number 10. This reading circuit is as described, for example, in Italian Patent Application No. 1999000002119, filed on Oct. 11, 1999 and which is incorporated herein by reference in its entirety and is assigned to the assignee of the present invention.

The reading circuit 10 is associated with a matrix 11 of non-volatile memory cells interconnected by bit lines and word lines. A cell 12 is identified by the intersection of a bit line BL and a word line WL. Column decoding circuits 8 activate the bit lines one at a time. Row decoding circuits 9 activate the word lines one at a time. A memory cell is selected by applying appropriate voltages between its electrodes, and is then read by circuit 10.

Each bit line has a parasitic capacitance indicated by $C_{BL}$, which is the sum of the input capacitances of the column cells, the capacitance of the selection transistor of the column decoding circuit and the capacitance of the conductor that connects the gate electrodes of the column cells. The first task of the reading circuit 10 is to charge the bit line capacitance $C_{BL}$. Only after the voltage applied to the capacitance $C_{BL}$ has exceeded a predetermined level will it become possible to read the selected cell.

Circuit 10 includes a detector for every bit line capable of sensing the current carried by the line. This detector comprises an N-channel MOS transistor, indicated by T1, that is connected to the bit line and to the positive pole VDD of a voltage source (whose negative pole, indicated by the ground symbol, is connected to the source electrodes of the matrix cells).

The source electrode of transistor T1 is connected not only with the bit line BL, but also with the input of an inverter stage INV1 that has its output connected to the gate electrode of the same transistor T1. The inverter stage INV1 includes a pair of complementary MOS transistors, or more precisely, an N-channel MOS transistor TN1 and a P-channel transistor TP1 connected as shown in the drawing. The gate electrode of transistor TP1 is connected to a constant-voltage source VP.

The reading circuit 10 also comprises a reference voltage generator 14 that comprises an N-channel MOS transistor T0 and an inverter stage INV0 made up of an N-channel MOS transistor TN0 and a P-channel MOS transistor TP0. The transistors T0, TN0 and TP0 are connected to each other and to the external voltage sources VDD and VP in the same way as the transistors T1, TN1 and TP1 are connected. The reference voltage generator 14 also comprises a constant current generator G0 that is connected between the source electrode of transistor T0 and ground.

Using appropriate connections that are well known to a person skilled in the art, the reading terminal of the detector, i.e., the gate electrode of the transistor associated with each bit line, can be connected to an input terminal of a comparator 16. For purposes of simplifying the figures, the gate electrode of the transistor T1 and the electrode indicated in the drawing by MAT are connected directly to the input terminal of the comparator 16. The gate electrode REF of the transistor T0 is connected to another input terminal of the comparator 16. The output terminal OUT of the comparator also forms the output of the reading circuit 10.

Once the circuit is operating in steady conditions when a cell is selected for reading, such as cell 12, for example, the current passing through the selected cell will also pass through the transistor T1. Since the transistor TN1 is in a constant current biasing condition due to the constant voltage VP applied to the gate terminal of the transistor TP1, the gate electrode of the transistor T1, i.e., the node MAT, will be at a voltage level that depends on this current.

Voltage generator 14 operates in a manner that is similar to that of the current detector described above, but since the current of generator G0 is constant, the gate electrode of transistor T0, i.e., the node REF, will remain at a constant voltage level. The components of generator 14 are dimensioned in such a manner that this constant voltage level will be between the two voltage levels that the node MAT can assume according to whether the associated cell is conducting or not.

Consequently, if the current passing through bit line BL is such that the voltage VMAT of the node MAT will be greater than reference voltage VREF on node REF, the output terminal OUT of comparator 16 will be in a first state corresponding to that of the programmed cell. Otherwise, the output terminal OUT will be in a second state corresponding to that of the non-programmed cell.

As already mentioned, the conditions described above refer to steady operating conditions. Let us now consider the dynamic behavior of the circuit during the reading. At the beginning of the reading the node MAT is substantially at the voltage VDD, the node TREF is substantially at a ground potential (zero), and the node BL likewise is at a ground potential because the capacitance $C_{BL}$ will be without a charge. At the beginning, the current passing through the transistor T1 is only such as is necessary to charge the capacitance $C_{BL}$. This is because the cell, even if it is programmed, i.e., capable of conducting, is not yet biased in such a way as to conduct because its drain voltage is too low.

In this initial phase there can occur critical operating conditions that may cause the voltage of the node MAT to be lower than it would be in steady conditions. This is due to the fact that transistor T1 and inverter INV1 are interconnected in such a way as to form a feedback loop that, even though it assures that the memory can be read very rapidly, may also create a transitory phenomenon that will cause the potential of node MAT to be smaller than its steady-condition value (undershooting). When this happens during the reading of a programmed cell, the node MAT can even arrive at a voltage smaller than the reference voltage VREF, in which case it will provide the comparator with an input signal that does not correspond to that of a programmed cell, but rather to the signal of an erased cell.

An analysis of the circuit system leads one to note that the phenomenon that has just been described can be attenuated by using a transistor T1 having a large transconductance, i.e., a low resistance while conducting. The charging of the capacitance $C_{BL}$ is effected through low-resistance components and is therefore completed at considerable speed. Unfortunately, however, a large transconductance also implies a low reading sensitivity. In fact, in direct-current operation the reading sensitivity, i.e., the ratio between the voltage of node MAT and the current that passes through transistor T1, is inversely proportional to the transconductance of the transistor.

SUMMARY OF THE INVENTION

In view of the foregoing background, an object of the present invention is to provide a reading circuit that will permit the parasitic capacitance of the bit line to be charged very quickly (and thus to have a very brief reading time), and at the same time to assure a very high operating reliability by avoiding the risk of transitory voltage variations that could lead to erroneous readings of the memory cells.

This and other objects advantages and features in accordance with the present invention are provided by a reading circuit for a non-volatile memory comprising a matrix of memory cells, and a plurality of bit lines connected thereto. The reading circuit preferably comprises a comparator having first and second inputs, and an output forming an output of the reading circuit. A reference voltage generator may be connected to the first input of the comparator, and a detection circuit for each bit line includes a reading terminal that is selectively connected to the second input of the comparator. The detection circuit detects a current through a respective bit line.

The detection circuit may comprise a first transistor comprising a gate connected to the reading terminal, and a drain and a source connected in series with the respective bit line. A first inverter stage has an input connected to the source of the first transistor, and an output connected to the gate of the first transistor. A first resistive element is connected between the source of the first transistor and the respective bit line.

A second transistor comprises a gate, and a source and drain connected in series with the respective bit line. A second resistive element is connected between the source of the second transistor and the respective bit line. A second inverter stage has an input connected to the source of the second transistor, and an output connected to the gate of the second transistor.

A third transistor comprises a gate connected to the gate of the second transistor, and a drain and a source connected in parallel with the drain and source of the first transistor. A third inverter stage has an input connected to the respective bit line, and an output connected to the gate of the second transistor.

The input of the third inverter stage may be connected to the respective bit line via a third resistive element, which could also be a portion of the second resistive element. The first, second and third inverter stages may be formed by standard inverters made up of pairs of complementary MOS transistors having common gates as their input, and common drains as their output.

BRIEF DESCRIPTION OF THE DRAWINGS

The invention will be more clearly understood from the detailed description given for a particular embodiment, which is to be considered an example and is not to be limiting in any way, and the description makes reference to the attached drawings of which.

DETAILED DESCRIPTION OF THE PREFERRED EMBODIMENTS

Figure 1:
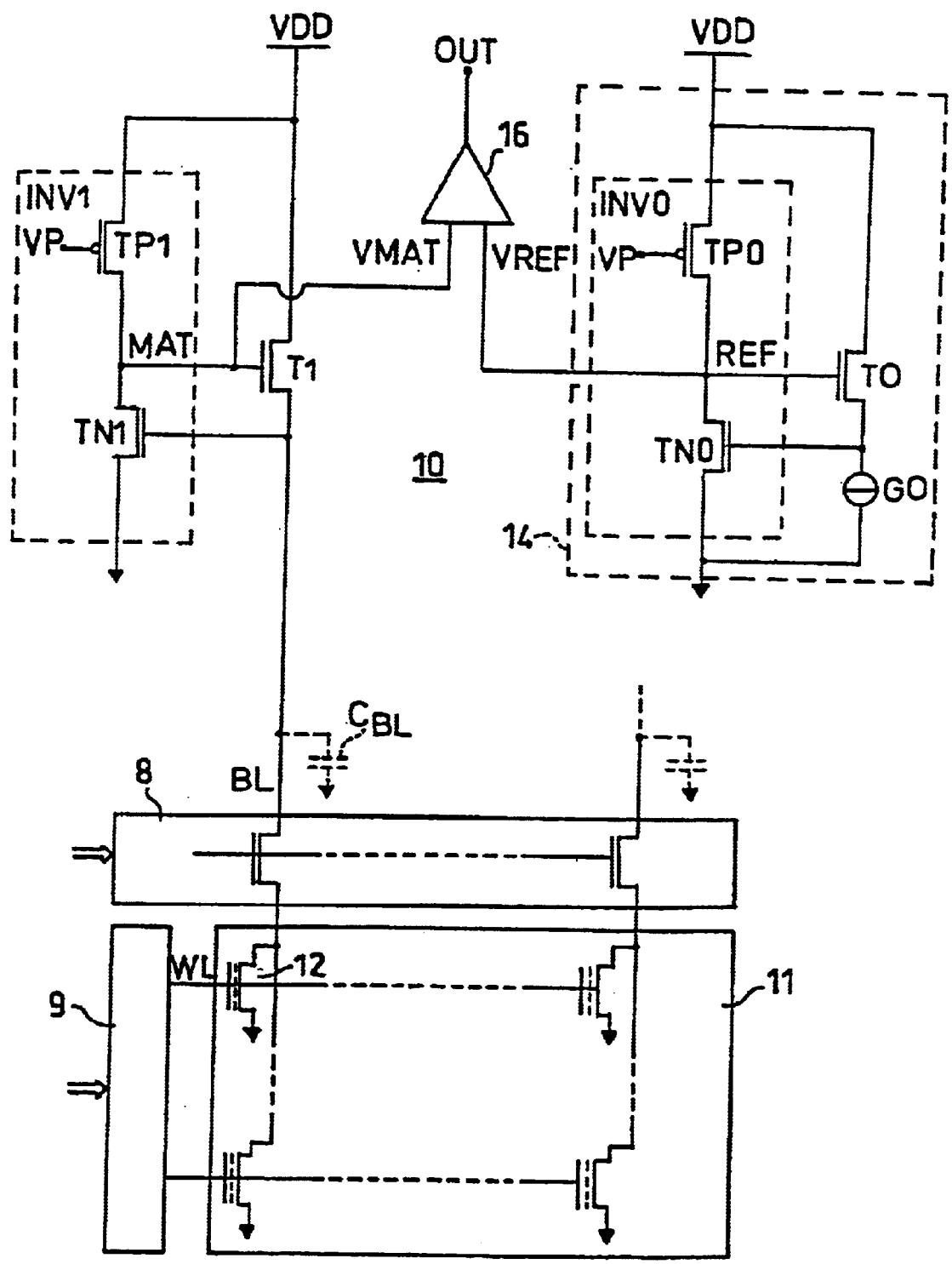
FIG. 1 shows a schematic layout of a reading circuit connected to a non-volatile memory in accordance with the prior art.
Figure 2:
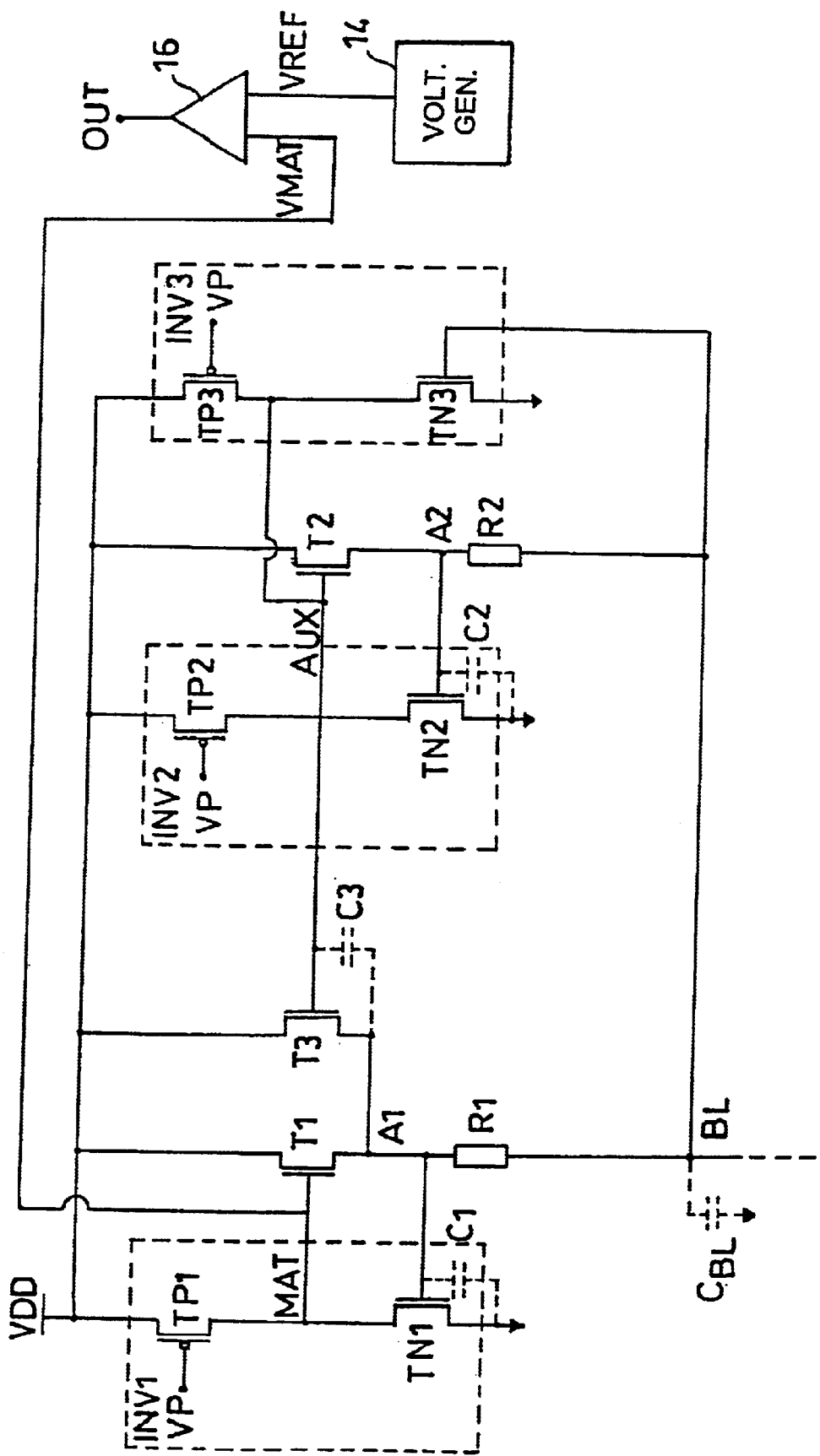
FIG. 2 shows a schematic layout of a reading circuit in accordance with the present invention.

The circuit of FIG. 2 comprises all the components of the reading circuit of FIG. 1, which are all indicated by the same reference numbers, and also a number of elements characteristic of the invention. More particularly, the circuit comprises a resistor R1 inserted between the source terminal A1 of the transistor T1 and the input node of the bit line BL, as well as an auxiliary circuit branch that is substantially equal to the branch that contains the transistor T1 and the inverter INV1. This latter branch is to be referred to as the principal branch.

The auxiliary branch includes an N-channel MOS transistor T2, an inverter stage INV 2 and a resistor R2 that in both form and size are preferably equal to, respectively, the transistor T1, the inverter INV1 and the resistor R1 and are also interconnected in the same way. The circuit also comprises an N-channel MOS coupling transistor T3 that has its drain, source and gate terminals connected to, respectively, the pole VDD of the voltage source, the connection node A1 between the source terminal of transistor T1 and resistor R1, and the gate terminal of transistor T2. This latter terminal is indicated as AUX.

The circuit further comprises a third inverter stage INV3, preferably equal to inverter stage INV1. The inverter stage INV3 includes an N-channel transistor TN3 and a P-channel transistor TP3 and has its input, i.e., the gate terminal of transistor TN3, connected to the bit line BL and its output connected to the gate terminal of transistor T2 of the auxiliary branch.

As far as the operation is concerned, the charging of the capacitance $C_{BL}$ commences as soon as the circuit is activated. Inverters INV1 and INV2 begin to regulate right away, that is, they respond very rapidly to an input variation (applied to nodes A1 and A2) with a commutation of the output. This is because the response is delayed only to a very limited extent by their low input capacitances, indicated by C1 and C2, due to nothing other than the gate-source capacitances of transistors TN1 and TN2.

The inverter INV3 is slower in coming into regulation because its input is connected to the input node of the bit line BL, which has a considerably larger capacitance. In this phase the regulation terminal of the principal branch and the auxiliary branch, i.e., the gate terminal of transistor T1 and the common gate terminals of transistors T2 and T3 will be at substantially the same potential. Since transistors T1 and T3 have the same voltage between gate and source, they jointly form a single virtual transistor with a high transconductance. As a result of this high transconductance, it becomes possible to use resistors R1 and R2 having a low resistivity, so that the preliminary charge or precharge of the bit line capacitance can be completed very quickly and without the risk of undershooting on the node MAT.

When the charging of the bit line capacitance $C_{BL}$ has been almost completed and the node BL attains a voltage such as to bring inverter INV3 into regulation, transistors T2 and T3 are cut off. The auxiliary branch is thus deactivated, while the principal branch remains active and transistor T1 continues to conduct right through to the end of the charging of the bit line capacitance $C_{BL}$ and the completion of the reading operation.

Figure 3:
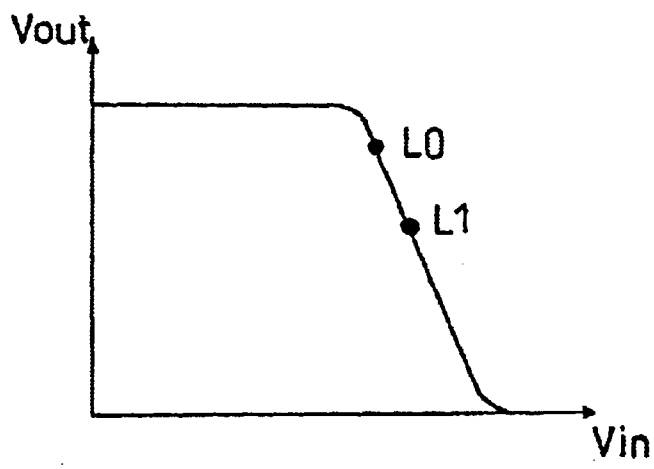
FIG. 3 shows the input/output characteristics of an inverter, including the operating point of the inverter in a circuit in accordance with the present invention and in a circuit in accordance with the prior art.

With reference to FIG. 3, the input/output characteristics ($V_{in}/V_{out}$) of an inverter that, when the fast-precharging auxiliary branch becomes deactivated, node A1, i.e., the input node of inverter INV1, will be at a voltage such as to make the inverter operate substantially at the center of its linear range, which on the graph is indicated by the point L1. When the inverter INV1 of the known circuit shown in FIG. 1 comes into regulation, its operating point will be situated at a higher voltage and is indicated by L0 on the graph.

With the circuit in accordance with the invention, the inverter will therefore be quicker to interrupt the charging of the bit line capacitance $C_{BL}$, because its operating point is situated in the gain zone at the center of the characteristics, while in the known circuit shown in FIG. 1, a certain time will elapse before the operating point becomes displaced into the gain zone. It is therefore possible for the bit line voltage to reach too high a value and to cause an undershooting of voltage VMAT such as to make VMAT smaller than VREF, which will produce an erroneous reading.

As a result of the presence of transistor T3, there will be a parasitic capacitance C3 between node A1 and node AUX (the gate-source capacitance of T3). Consequently, if for any reason there should occur an overshoot at node A1, this will produce an undershoot at nodes MAT and AUX (which, as previously noted, will have potentials that vary in the same way during the fast pre-charging phase). Due to capacitive coupling through the parasitic capacitance C3, this undershooting will reduce the voltage of node A1, thus compensating the undershooting.

Figure 4:
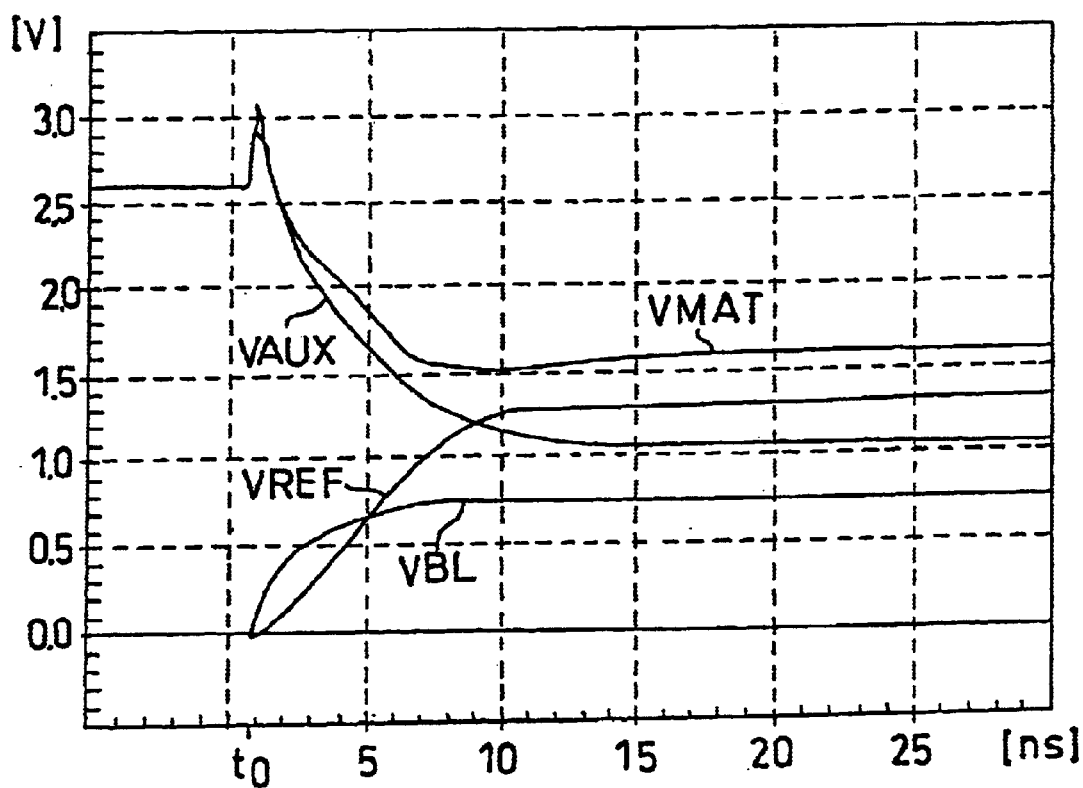
FIGS. 4, 5 and 6 are graphs that illustrate variations of the voltage over time of some of the nodes of the circuit of FIG. 2 during the operation of respectively reading a programmed cell, a virgin cell and an erased cell.
Figure 5:
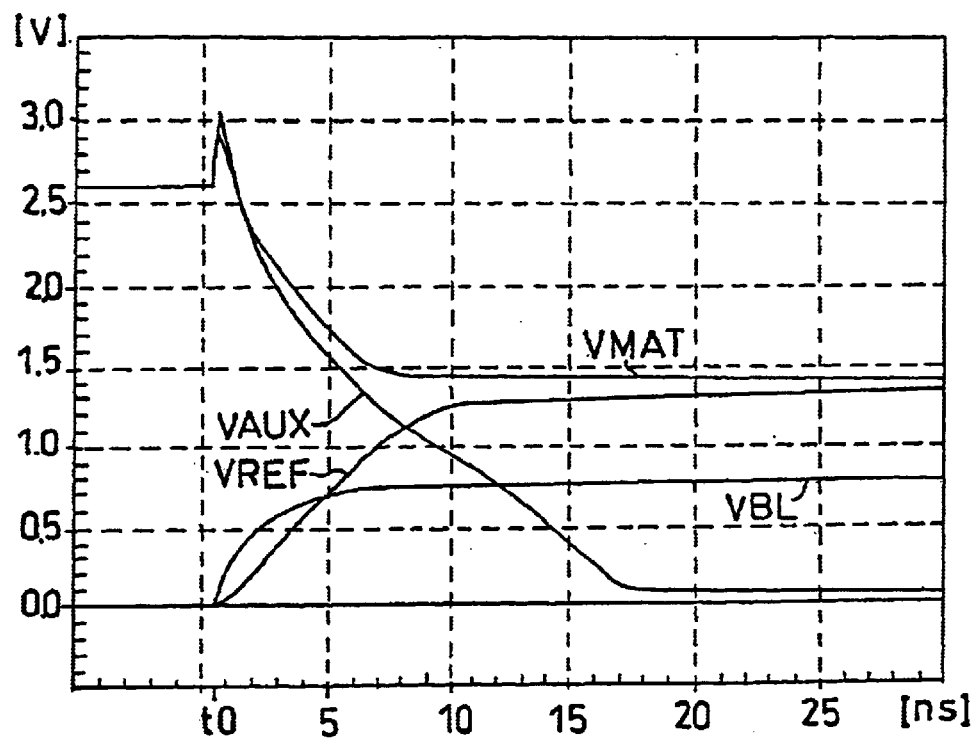
Figure 6:
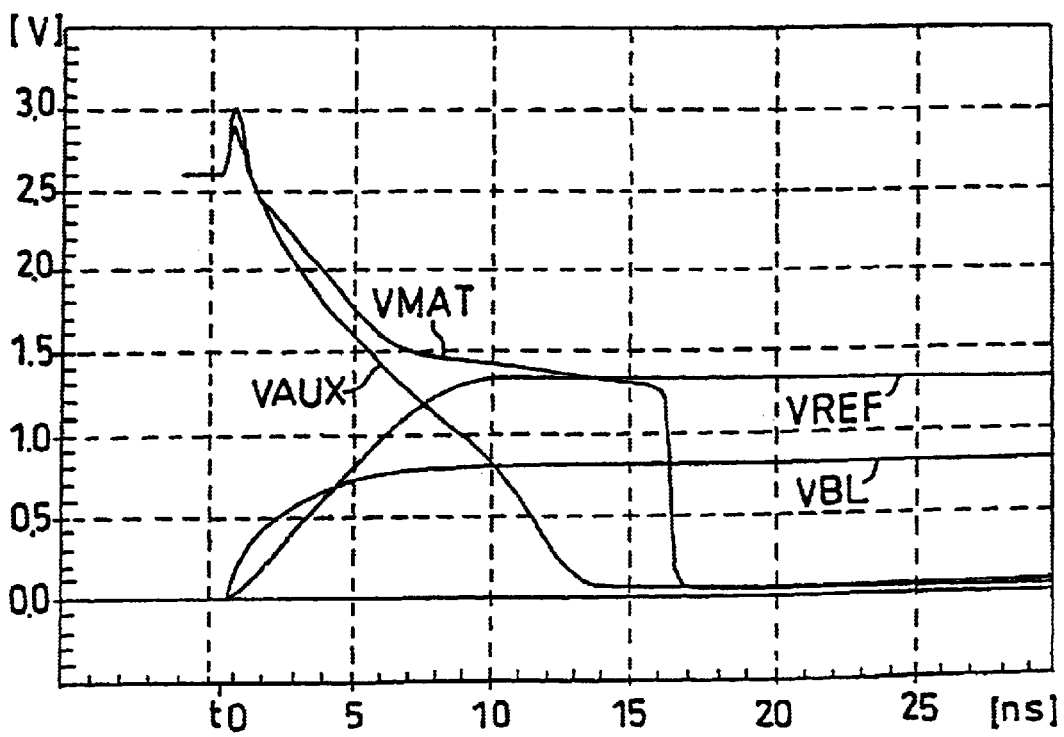

The graphs in FIGS. 4, 5 and 6 show the timing of the voltages on the principal nodes of the circuit shown in FIG. 2 in the operations of reading, respectively, a programmed cell, a virgin cell and an erased cell. Before the reading circuit is activated, nodes REF and BL will he at ground potential and node MAT will be at a potential (2.6 V in the example under consideration) close to the supply voltage VDD. This is similar to what happens in the known circuit of FIG. 1, i.e., node AUX is at the same voltage as node MAT.

When the circuit is activated at time t0, the voltage VREF of reference generator 14 very quickly (in about 10 ns in the present example) attains the constant reference voltage (about 1.3 V in this example), while the bit line capacitance $C_{BL}$ (in this example about 1.5 pF) is charged by the current furnished by transistors T1 and T3 until it reaches (after about 5 ns) a voltage close to the maximum charge voltage.

In the case of a programmed cell, i.e., a cell capable of conducting current, the voltage VMAT of node MAT, as can be seen in FIG. 4, first attains brief positive peaks, which is due to the fact that the input capacitance (node A1) of inverter INV1 becomes charged more rapidly than the output capacitance (node MAT). The voltage then drops rapidly due to the effect of the large transconductance of the virtual transistor formed by the two transistors T1 and T3, eventually arriving at the steady voltage (about 1.6 V) with only a very small undershooting (about 0.1 V).

This does not however, involve the risk of an erroneous reading, because node REF will then be at a considerably lower voltage VREF (1.1–1.3 V). The voltage at node AUX behaves in exactly the same way as the voltage at node MAT, but drops to an even lower level (about 1.1 V), because the auxiliary branch keeps on conducting a weak current. However, this does not give rise to any problems, because voltage VAUX has no effect on voltage VMAT.

Reading a virgin cell is generally the most critical case, because the current absorbed by the cell is only slightly greater (just a few $\mu A$) than the reference current. FIG. 5 considers the particularly unfavorable case of a virgin cell that absorbs a current only 1 $\mu A$ greater than the reference current. The voltage VMAT at node MAT drops very rapidly in a first phase corresponding to the charging of the bit line capacitance $C_{BL}$, and then slows down without undershooting in the vicinity of the steady voltage. At all times this voltage remains sufficiently far away from the reference voltage VREF. The first phase corresponds to the charging of the bit line capacitance $C_{BL}$. In the first phase the voltage VAUX at node AUX behaves just like the voltage VMAT, but then continues to drop because transistors T2 and T3 stop conducting.

When an erased cell has to be read, it can be seen from the graph of FIG. 6 that the voltage at nodes REF, BL and AUX varies as in the case of a virgin cell. This is while the voltage at node MAT at first diminishes until it crosses the curve of node REF at less than 15 ns from the starting time t0, and then drops rapidly to zero. This causes comparator 16 to switch and bring its output OUT to the state corresponding to the reading of an erased cell.

Summarizing, the reading circuit in accordance with the invention has the following advantageous characteristics: it can be used without problems with supply voltages in a very wide range of values (1.8–3.0 V); it makes possible very brief reading times (15 ns); it can provide relatively high capacitive charges (1.5 pF); it is not associated with any appreciable overshooting or undershooting phenomena; and it has a high detection sensitivity (1 $\mu A$ of difference between cell current and reference current).

Although only a single embodiment of the invention has here been illustrated and described, it is clear that numerous variations and modifications are possible within the underlying inventive concept. For example, the input of inverter stage INV3 could be connected to node BL via a resistor, which could also be a portion of resistor R2. The auxiliary branch could be formed by transistors T2, TN2 and TP2 which are respectively different from transistors T1, TN1 and TP1 of the principal branch, and even resistors R1 and R2 could be different from each other. Furthermore, the inverter stages could be formed by standard inverters made up of pairs of complementary MOS transistors having common gate terminals of the two transistors of the pair as their input, and the common drain terminals as their output.

That which is claimed is:

1. A reading circuit for a non-volatile memory comprising a matrix of cells and a plurality of bit lines connected thereto, the reading circuit comprising:

a comparator having first and second inputs, and an output defining an output of the reading circuit;

a reference voltage generator connected to the first input of said comparator; and detection means for each bit line and including a reading terminal being selectively connected to the second input of said comparator for detecting a current through a respective bit line, said detection means comprising a first transistor comprising a gate connected to the reading terminal, and a drain and a source connected in series with the respective bit line, a first inverter stage having an input connected to the source of said first transistor, and an output connected to the gate of said first transistor, a first resistive element connected between the source of said first transistor and the respective bit line, a second transistor comprising a gate, and a source and drain connected in series with the respective bit line, a second resistive element connected between the source of said second transistor and the respective bit line, a second inverter stage having an input connected to the source of the second transistor, and an output connected to the gate of said second transistor, a third transistor comprising a gate connected to the gate of said second transistor, and a drain and a source connected in parallel with the drain and source of said first transistor, and a third inverter stage having an input connected to the respective bit line, and an output connected to the gate of said second transistor.

2. A reading circuit according to claim 1, wherein at least one of said first, second and third inverter stages comprises a MOS transistor in a constant-current biasing condition.

3. A reading circuit according to claim 1, further comprising a third resistive element connected between the input of said third inverter stage and the respective bit line.

4. A reading circuit according to claim 1, wherein said second resistive element comprises first and second resistive portions, with the first resistive portion being connected as the second resistive element, and the second resistive portion being connected as a third resistive element between the input of said third inverter stage and the respective bit line.

5. A memory comprising:

a matrix of memory cells arranged in rows and columns;

a plurality of bit lines connected to the columns of said matrix of memory cells; and a reading circuit connected to said plurality of bit lines and comprising a comparator having a first input for receiving a voltage reference, a second input, and an output defining an output of said reading circuit, and a detection circuit for each bit line and being selectively connected to the second input of said comparator for detecting a current through a respective bit line, said detection circuit comprising a first transistor comprising a gate connected to the first input of said comparator, and a drain and a source connected in series with the respective bit line, a first inverter stage having an input connected to the source of said first transistor, and an output connected to the gate of said first transistor, a first resistive element connected between the source of said first transistor and the respective bit line, a second transistor comprising a gate, and a source and drain connected in series with the respective bit line, a second resistive element connected between the source of said second transistor and the respective bit line, and a second inverter stage having an input connected to the source of the second transistor, and an output connected to the gate of said second transistor.

6. A memory according to claim 5, further comprising:

a third transistor comprising a gate connected to the gate of said second transistor, and a drain and a source connected in parallel with the drain and source of said first transistor, and a third inverter stage having an input connected to the respective bit line, and an output connected to the gate of said second transistor.

7. A memory according to claim 5, further comprising a reference voltage generator connected to the first input of said comparator for providing the voltage reference thereto.

8. A memory according to claim 6, wherein at least one of said first, second and third inverter stages comprises a MOS transistor in a constant-current biasing condition.

9. A memory according to claim 6, further comprising a third resistive element between the input of said third inverter stage and the respective bit line.

10. A memory according to claim 6, wherein said second resistive element comprises first and second resistive portions, with the first resistive portion being connected as the second resistive element, and the second resistive portion being connected as a third resistive element between the input of said third inverter stage and the respective bit line.

11. A memory according to claim 5, wherein said memory cells are configured so that the memory is a non-volatile memory.

12. A method for making a reading circuit for a memory comprising a matrix of cells and a plurality of bit lines connected thereto, the method comprising:

providing a comparator having first and second inputs, and an output defining an output of the reading circuit;

providing a reference voltage generator connected to the first input of the comparator; and providing a detection circuit for each bit line that includes a reading terminal selectively connected to the second input of the comparator for detecting a current through a respective bit line, providing the detection circuit comprising connecting a gate of a first transistor to the reading terminal, and connecting a drain and a source of the first transistor in series with the respective bit line, connecting an input of a first inverter stage to the source of the first transistor, and connecting an output of the first inverter stage to the gate of the first transistor, connecting a first resistive element between the source of the first transistor and the respective bit line, connecting a source and drain of a second transistor in series with the respective bit line;

connecting a second resistive element between the source of the second transistor and the respective bit line, and connecting an input of a second inverter stage to the source of the second transistor, and connecting an output of the second inverter stage to a gate of the second transistor.

13. A method according to claim 12, wherein providing the detection circuit further comprises:

connecting a gate of a third transistor to the gate of the second transistor, and connecting a drain and a source of the third transistor in parallel with the drain and source of the first transistor; and connecting an input of a third inverter stage to the respective bit line, and connecting an output of the third inverter stage to the gate of the second transistor.

14. A method according to claim 13, wherein at least one of the first, second and third inverter stages comprises a MOS transistor in a constant-current biasing condition.

15. A method according to claim 13, further comprising a third resistive element connected between the input of the third inverter stage and the respective bit line.

16. A method according to claim 13, wherein the second resistive element comprises first and second resistive portions, with the first resistive portion being connected as the second resistive element, and the second resistive portion being connected as a third resistive element between the input of the third inverter stage and the respective bit line.

17. A method according to claim 12, wherein the memory cells are configured so that the memory is a non-volatile memory.

* * * * *

UNITED STATES PATENT AND TRADEMARK OFFICE
CERTIFICATE OF CORRECTION

PATENT NO. : 6,667,908 B2  
DATED : December 23, 2003  
INVENTOR(S) : Antonio Conte and Oreste Concepito It is certified that error appears in the above-identified patent and that said Letters Patent is hereby corrected as shown below:

<u>Title page,</u>  
Insert item:  
-- [30]         Foreign Application Priority Data  
         May 24, 2001  (IT) .............RM 2001 A 000282 --

<u>Column 1,</u>  
Line 11, delete "The present invention relates to memory It is well know" insert -- It is well known --

Signed and Sealed this

Eleventh Day of May, 2004

JON W. DUDAS  
*Acting Director of the United States Patent and Trademark Office*